(12) United States Patent
Zhu et al.

(10) Patent No.: US 8,957,481 B2
(45) Date of Patent: Feb. 17, 2015

(54) SEMICONDUCTOR STRUCTURE AND METHOD FOR MANUFACTURING THE SAME

(75) Inventors: Huilong Zhu, Poughkeepsie, NY (US); Huicai Zhong, San Jose, CA (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 30 days.

(21) Appl. No.: 13/379,407

(22) PCT Filed: May 11, 2011

(86) PCT No.: PCT/CN2011/073919
§ 371 (c)(1), (2), (4) Date: Dec. 20, 2011

(87) PCT Pub. No.: WO2012/041064
PCT Pub. Date: Apr. 5, 2012

(65) Prior Publication Data
US 2012/0187501 A1 Jul. 26, 2012

(30) Foreign Application Priority Data
Sep. 30, 2010 (CN) .......................... 2010 1 0501727

(51) Int. Cl.
*H01L 21/70* (2006.01)
*H01L 27/12* (2006.01)
*H01L 21/8238* (2006.01)
(Continued)

(52) U.S. Cl.
CPC ...... *H01L 21/3086* (2013.01); *H01L 21/76224* (2013.01); *H01L 29/7848* (2013.01); *H01L 29/66636* (2013.01); *H01L 21/76229* (2013.01)
USPC .... 257/369; 257/510; 257/351; 257/E21.632; 257/E21.634; 438/199; 438/221; 438/296

(58) Field of Classification Search
CPC ................. H01L 21/3086; H01L 21/76229; H01L 21/76224; H01L 29/66636; H01L 29/7848
USPC ......... 257/288, 351, 368, 369, 374, 377, 384, 257/510, E21.632–E21.634, E21.642; 438/197, 199, 221, 294–296, 299, 301
See application file for complete search history.

(56) References Cited

U.S. PATENT DOCUMENTS
2001/0050396 A1* 12/2001 Esaki ............................ 257/346
(Continued)

FOREIGN PATENT DOCUMENTS
CN 1945832 A 4/2007
CN 1011199037 A 6/2008

OTHER PUBLICATIONS
International Search Report PCT/CN2011/073919.
(Continued)

*Primary Examiner* — Fernando L Toledo
*Assistant Examiner* — Aaron Gray
(74) *Attorney, Agent, or Firm* — Troutman Sanders LLP (57) ABSTRACT

The present application discloses a semiconductor structure and a method for manufacturing the same. Compared with conventional approaches to form contacts, the present disclosure reduces contact resistance and avoids a short circuit between a gate and contact plugs, while simplifying manufacturing process, increasing integration density, and lowering manufacture cost. According to the manufacturing method of the present disclosure, second shallow trench isolations are formed with an upper surface higher than an upper surface of the source/drain regions. Regions defined by sidewall spacers of the gate, sidewall spacers of the second shallow trench isolations, and the upper surface of the source/drain regions are formed as contact holes. The contacts are formed by filling the contact holes with a conductive material. The method omits the steps of etching for providing the contact holes, which lowers manufacture cost. By forming the contacts self-aligned with the gate, the method avoids misalignment and improves performance of the device while reducing a footprint of the device and lowering manufacture cost of the device.

26 Claims, 11 Drawing Sheets

(51) Int. Cl.
*H01L 21/336* (2006.01)
*H01L 21/308* (2006.01)
*H01L 21/762* (2006.01)
*H01L 29/78* (2006.01)
*H01L 29/66* (2006.01)

(56) References Cited

U.S. PATENT DOCUMENTS

2007/0018205 A1* 1/2007 Chidambarrao et al. ..... 257/288
2008/0121985 A1* 5/2008 Chen et al. ................... 257/327
2008/0169490 A1* 7/2008 Kawai .......................... 257/288
2008/0230805 A1* 9/2008 Hokazono et al. ........... 257/190
2009/0166755 A1* 7/2009 Chakravarthi et al. ....... 257/390
2009/0194825 A1* 8/2009 Werner et al. ................ 257/397
2010/0052034 A1* 3/2010 Cheng et al. ................. 257/316

OTHER PUBLICATIONS

Written Opinion PCT/CN2011/073919.

* cited by examiner

SEMICONDUCTOR STRUCTURE AND METHOD FOR MANUFACTURING THE SAME

TECHNICAL FIELD

The present disclosure relates to a technical field of semiconductor, and more particularly, to a semiconductor structure having self-aligned contacts and a method for manufacturing the same.

BACKGROUND

When manufacturing a semiconductor device, an insulating layer is typically formed after formation of a gate, and metal contact holes for exposing source/drain regions are then formed by an etching process. After that, the contact holes are filled with a conductive material to form contact plug structures.

With the rapid development of semiconductor manufacturing procedure and/or process, characteristic dimensions of devices continue to reduce, and contact dimension (i.e. contact diameter) is scaled down, so as to ensure that the contact will not cause a short circuit between source/drain diffusion regions and the gate. However, scaling down the contact size significantly increases contact resistance and makes it difficult to form the contact. Moreover, the gate may be exposed during the process of etching the contact holes, especially in a case of misalignment. Consequently, shorts may occur between the gate and the contact plugs.

In view of this, there is a need to provide a novel semiconductor structure and a method for manufacturing the same, which can reduce the contact resistance and suppress or avoid the shorts, while simplifying manufacturing process and lowering manufacture cost.

SUMMARY OF THE DISCLOSURE

An object of the present disclosure is to provide a semiconductor structure and a method for manufacturing the same for solving the above problems in the prior art.

According to one aspect of the disclosure, there is provided a semiconductor structure, comprising:
 a semiconductor substrate;
 at least one gate formed on the semiconductor substrate;
 sidewall spacers adjacent to the gate;
 source/drain regions on both sides of the gate;
 contacts formed on the source/drain regions;
 first shallow trench isolations which are embedded in the semiconductor substrate and have a length direction parallel to a length direction of the gate;
 second shallow trench isolations which are located on both sides of the outmost source/drain regions, connected with the first shallow isolations to form an isolation region;
 wherein an upper surface of the second shallow trench isolation is higher than an upper surface of the source/drain regions.

Preferably, the contacts are self-aligned with the gate.

Preferably, the semiconductor structure further comprises sidewall spacers of the second shallow trench isolations which are adjacent to the respective second trench isolations at a side close to the source/drain regions.

Preferably, the source/drain regions are self-aligned with the gate.

Optionally, the sidewall spacers are made of $Si_3N_4$.

Preferably, the source/drain regions comprise a stressed material.

Optionally, the stressed material is $Si_{1-x}Ge_x$ for a pMOSFE, where $0<x<1$, and Si:C for an nMOSFET.

Optionally, in the $Si_{1-x}Ge_x$, an atom percentage of Ge is in a range of about 15%-70%; and in the Si:C, an atom percentage of C is in a range of about 0.2%-2%.

Optionally, a filling dielectric in the second shallow trench isolations is $Si_3N_4$.

According to another aspect of the disclosure, there is provided a method for manufacturing a semiconductor structure, comprising:
 providing a semiconductor substrate;
 forming first shallow trench isolations and second shallow trench isolations which are connected with each other and form an isolation region;
 forming at least one gate which includes a dielectric layer and a conductive layer and has a length direction parallel to a length direction of the first shallow trench isolations;
 forming sidewall spacers of the gate;
 forming source/drain regions at both sides of the gate;
 forming contacts on the source/drain regions, wherein:
 the second shallow trench isolations are oppositely located on both sides of the outmost source/drain regions, and
 an upper surface of the second shallow trench isolation is higher than an upper surface of the source/drain regions.

Preferably, the contacts are self-aligned with the gate.

Preferably, the upper surface of the second shallow trench isolation is about 20-150 nm higher than the upper surface of the source/drain regions.

Preferably, sidewall spacers of the second shallow trench isolations are formed at a side of the respective second trench isolations close to the source/drain regions.

Preferably, the step of forming contacts comprises: forming a region defined by the sidewall spacer of the gate, the sidewall spacer of the second shallow trench isolation which is adjacent to the sidewall spacer of the gate, and an upper surface of the source/drain regions as a contact hole, or forming a region defined by two adjacent sidewall spacers of two adjacent gates and an upper surface of the source/drain regions as a contact hole; and filling the contact hole with a conductive material to form the contact.

Preferably, the source/drain regions are formed at both sides of the gate in a self-aligned manner.

Preferably, the step of forming the source/drain regions comprises:
 etching the gate dielectric layer and the semiconductor substrate downwards with the sidewall spacer of the gate and the sidewall spacer of the second shallow trench isolation which is adjacent to the gate as a boundary, or with two adjacent sidewall spacers of two adjacent gates as a boundary, to form a source/drain groove; and
 epitaxially growing a stressed material in a case where a portion of the source/drain groove adjacent to the gate or a portion of the source/drain groove adjacent to the second shallow trench isolation serves as a first seed layer, the a bottom of the source/drain groove serves as a second seed layer, and a portion of the source/drain groove adjacent to the adjacent gate serves as a third seed layer.

Optionally, before formation of the source/drain groove and after formation of the gate, the method further comprises: forming source/drain extensions and source/drain halos.

Optionally, the step of forming the source/drain extensions comprises: implanting one selected from a group consisting of B, $BF_2$, In and their combinations for a pMOSFET, and implanting one selected from a group consisting of As, P and their combinations for an nMOSFET.

Optionally, the step of forming the source/drain halos comprises implanting one selected from a group consisting of As, P and their combinations for a pMOSFET, and implanting one selected from a group consisting of B, $BF_2$, In and their combinations for an nMOSFET.

Optionally, the stressed material is $Si_{1-x}Ge_x$ which provides a compressive stress for a pMOSFET, and is Si:C which provides a tensile stress for an nMOSFET.

Optionally, in the $Si_{1-x}Ge_x$, an atom percentage of Ge is in a range of about 15%-70%; and in the Si:C, an atom percentage of C is in a range of about 0.2%-2%.

Optionally, the source/drain regions are in-situ doped when epitaxially growing the stressed material.

Optionally, the source/drain regions are in-situ doped with B when epitaxially growing $Si_{1-x}Ge_x$, and with P when epitaxially growing Si:C.

Optionally, a filling dielectric in the second shallow trench isolations is $Si_3N_4$.

Compared with the conventional technology, the technical solution according to the present disclosure has the following beneficial effects.

The second shallow trench isolations have the upper surface higher than the upper surface of the source/drain regions, and the regions defined by the sidewall spacers of the gate, the sidewall spacers of the second shallow trench isolations which are adjacent to the gate, and the upper surface of the source/drain regions are formed as the contact holes, which omits the steps of etching for the contact holes and lowers manufacture cost.

By forming the contacts self-aligned with the gate, the method avoids misalignment and improves performance of the device while reducing a footprint of the device and lowering manufacture cost of the device.

The shallow trench isolations have the upper surface higher than the upper surface of the source/drain regions, which prevents the stress to be released via lateral interfaces and enhances the stress in the channel region, and in turn increases mobility of carriers.

Furthermore, the stressed material can be provided in the source/drain regions, for example by epitaxial growth so that the channel region subjects to the stress. For example, the source/drain regions produce compressive stress in a pMOSFET, and produce tensile stress in an nMOSFET. By adjusting the stress in the channel region of the device, mobility of carriers in the channel region can be increased.

By epitaxially growing the stressed material such as $Si_{1-x}Ge_x$ in a case where the portion of the source/drain groove adjacent to the gate or the portion of the source/drain groove adjacent to the second shallow trench isolation serves as a first seed layer, the bottom of the source/drain groove serves as a second seed layer, and the portion of the source/drain groove adjacent to the adjacent gates serves as a third seed layer, crystal quality can be improved because uniform single crystal is formed in the source/drain regions with high quality, which reduces parasitic resistance of the source and the drain.

The dielectric in the shallow trench isolations is preferably nitride which reduces the loss of the dielectric in the subsequent processing steps.

Moreover, by forming the source/drain extensions and the source/drain halos, the short channel effects are suppressed.

BRIEF DESCRIPTION OF THE DRAWINGS

The cross-sectional views in FIGS. 6-21 are all taken along the line (11') indicated in corresponding top views in FIGS. 6-21.

DETAILED DESCRIPTION

The present disclosure will be described below with preferred embodiments in connection with attached drawings. The same or similar reference numerals are used throughout the attached drawings to indicate the same or similar part or the part having the same or similar function. The embodiments described below in connection with the attached drawings are only illustrative for explaining the present disclosure, and are not construed as limiting the disclosure.

The disclosure below provides various embodiments or examples for implementing the technical solutions of the present disclosure. Although some specific examples of the parts and arrangements are described, the examples are only illustrative, and are not construed as limiting the present disclosure.

Moreover, the disclosure provides examples of various specific processes and/or materials. Nevertheless, one skilled person in the art will appreciate that other processes and/or materials can also be used as alternatives, without departing from the protection scope of the disclosure. Note that relations of various structures described herein include necessary extensions introduced by the process. For example, the phrase "parallel to" means that two planes have an angle deviating from 0° within tolerance of the process.

FIGS. 1-22 illustrate respective steps in manufacturing a semiconductor structure according to an embodiment of the present disclosure. The respective steps in the embodiment of the present disclosure and a resultant semiconductor structure will be described below in detail in connection with the attached drawings.

Figure 1:
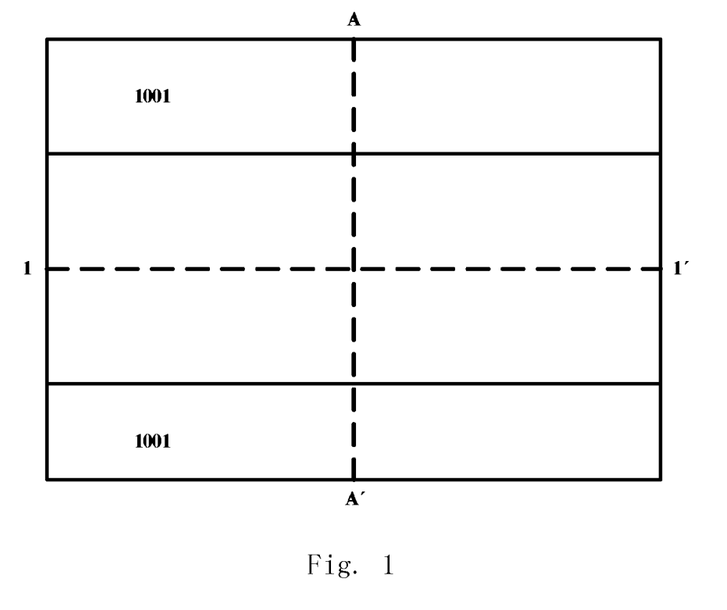
FIGS. 1-3 show a top view, a cross-sectional view along the line (AA'), and a cross-sectional view along the line (11') of a semiconductor structure after first shallow trench isolations are formed on a substrate in a method for manufacturing the semiconductor structure according to an embodiment of the present disclosure, respectively.
Figure 2:
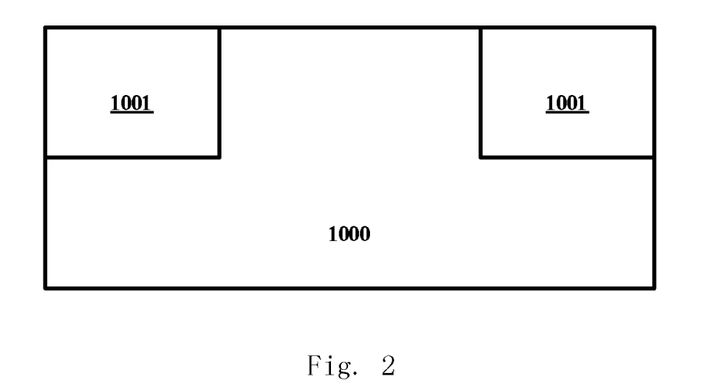
Figure 3:
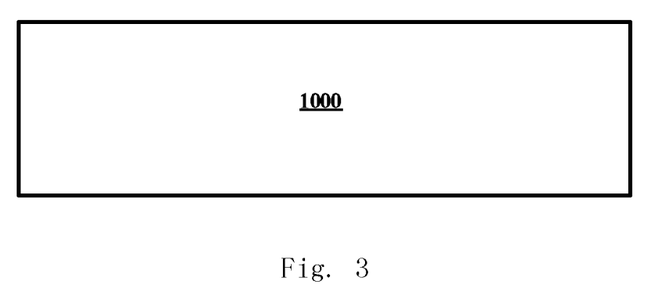

First, a semiconductor substrate 1000 is provided, and first shallow trench isolations 1001 are formed on the semiconductor substrate by a conventional process, as shown in FIGS. 1-3. The substrate 1000 can be bulk Si or Silicon On Insulator (SOI) or other suitable semiconductor materials, for example, group III-V semiconductor compounds such as GaAs.

Figure 4:
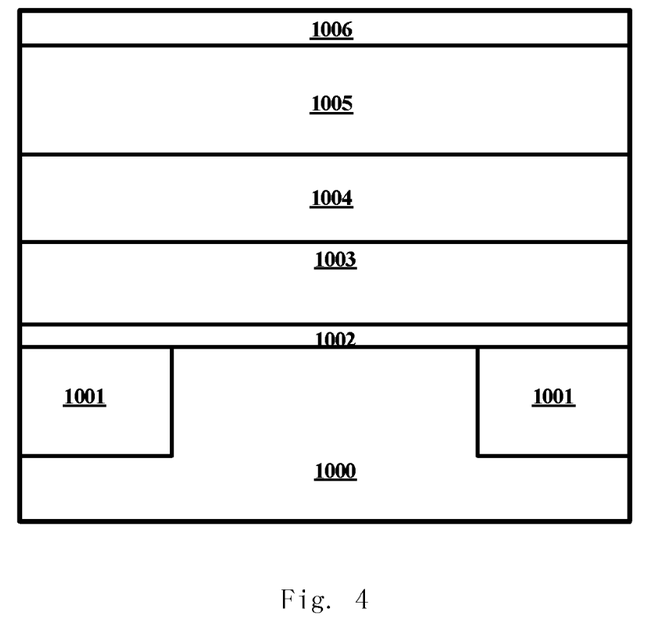
FIGS. 4-5 show a cross-sectional view along the line (AA') and a cross-sectional view along the line (11') of the semiconductor structure after respective material layers are formed on a substrate in the method for manufacturing the semiconductor structure according to the embodiment of the present disclosure, respectively.
Figure 5:
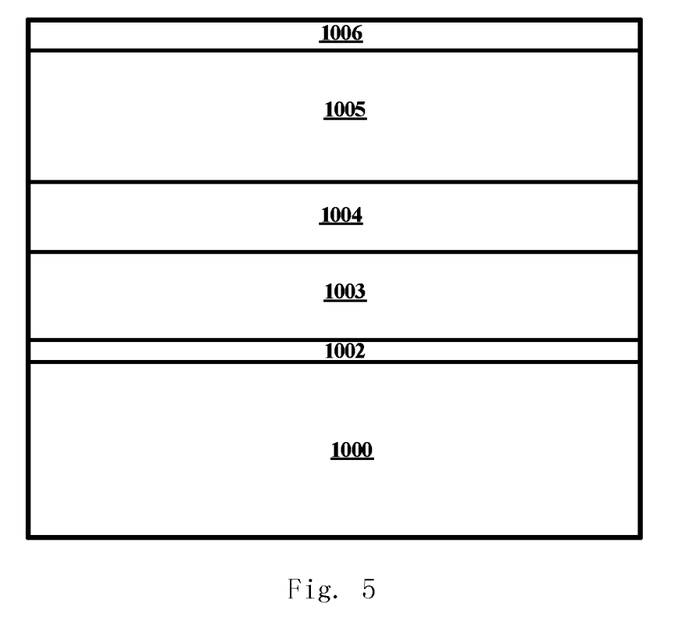

As shown in FIGS. 4 and 5, a gate dielectric layer 1002, a conductive layer (for example, a metal layer and/or a polysilicon layer, such as a first polysilicon layer 1003 in an embodiment of the present disclosure), a nitride layer 1004, a second polysilicon layer 1005, and an oxide layer 1006 are formed in sequence on the semiconductor substrate 1000. These layers can be deposited by a conventional deposition process.

The gate dielectric layer 1002 can be made of any one selected from a group consisting of $HfO_2$, $HfSiO$, $HfSiON$, $HfTaO$, $HfTiO$, $HfZrO$, $Al_2O_3$, $La_2O_3$, $ZrO_2$, and $LaAlO$, or their combinations.

The gate dielectric layer 1002 can have a thickness in a range of about 1-3 nm, for example, 2 nm. The first polysilicon layer 1003 can have a thickness in a range of about 50-100 nm, for example, 60 nm, 70 nm, 80 nm, or 90 nm. The nitride layer 1004 can have a thickness in a range of about 50-70 nm, for example, 55 nm, 60 nm or 65 nm. The second polysilicon layer 1005 can have a thickness in a range of about 100-150 nm, for example, 110 nm, 120 nm, 130 nm or 140 nm. The oxide layer 1006 can have a thickness in a range of about 10-20 nm, for example, 15 nm.

Figure 6:
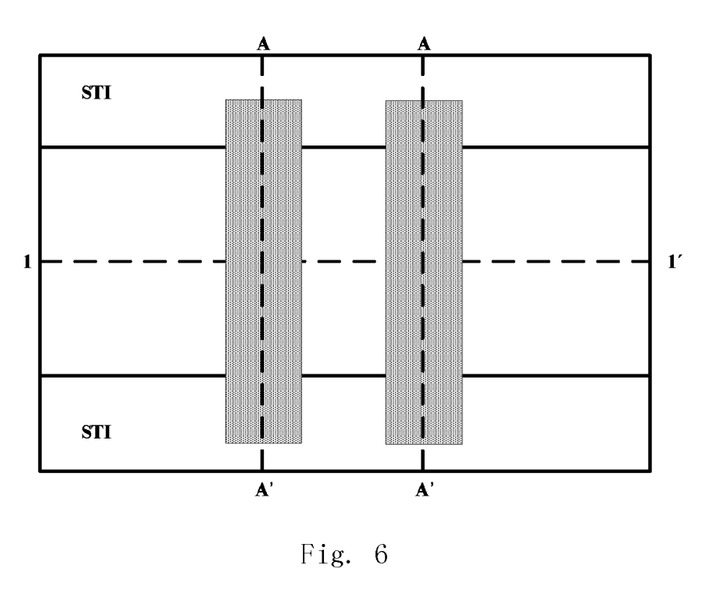
FIGS. 6-7 show a top view and a cross-sectional view of a semiconductor structure after patterning a gate in the method for manufacturing the semiconductor structure according to the embodiment of the present disclosure, respectively.
Figure 7:
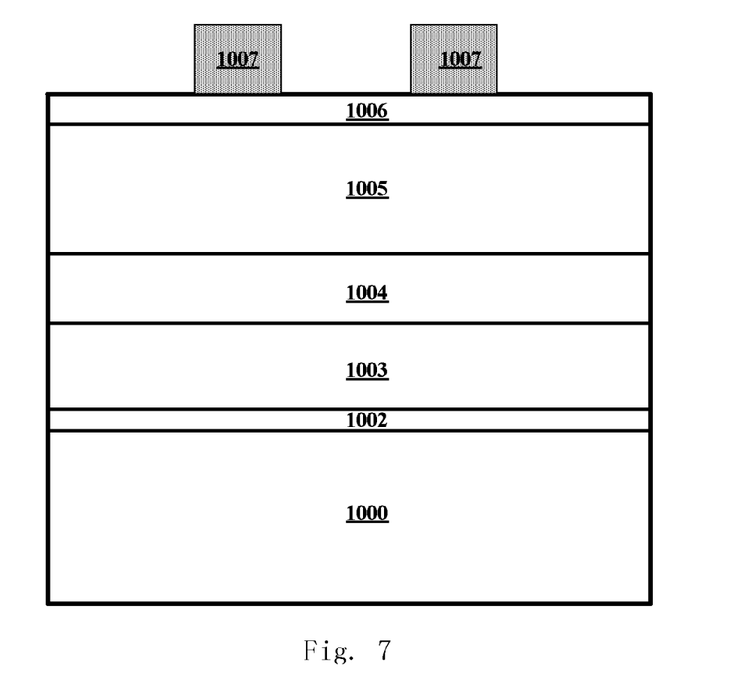
Figure 8:
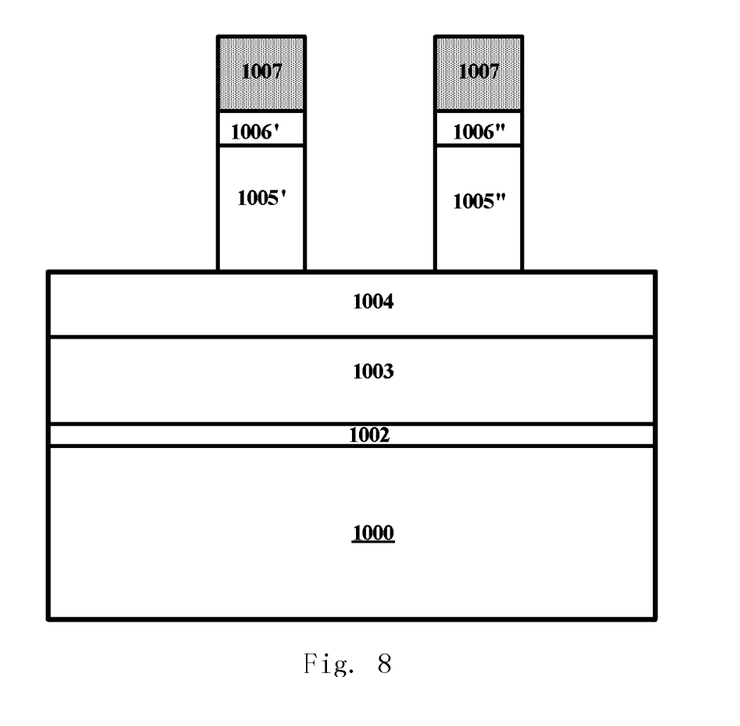
FIG. 8 shows a cross-sectional view of a semiconductor structure after etching an oxide layer and a polysilicon layer in the method for manufacturing the semiconductor structure according to the embodiment of the present disclosure.

The gate is then patterned. Specifically, the oxide layer 1006 is spin-coated with a photoresist layer 1007. The photoresist layer 1007 is baked at a predetermined temperature, exposed and developed with a mask pattern for a gate, and processed at a high temperature to form a photoresist pattern on the oxide layer, as shown in FIGS. 6 and 7. The oxide layer 1006 and the second polysilicon layer 1005 are etched to form a structure comprising remaining portions denoted by 1006', 1006", 1005' and 1005", as shown in FIG. 8. In this embodiment, reactive ion etching is performed. The type and the flow rate of an etching gas can be properly adjusted depending on the type of the material being etched and the structure of the device.

Figure 9:
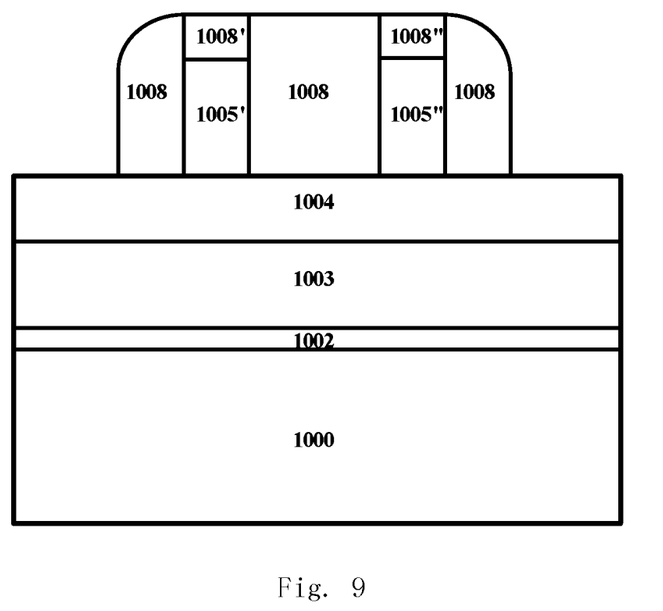
FIG. 9 shows a cross-sectional view of a semiconductor structure after forming oxide caps and sidewall spacers in the method for manufacturing the semiconductor structure according to the embodiment of the present disclosure.

The photoresist layer 1007 is removed by a method well known in the art. An oxide layer is deposited to have a thickness in a range of about 40-100 nm, for example, 50 nm, 60 nm, 70 nm, 80 nm, or 90 nm. The oxide layer is etched to form oxide caps 1008' and 1008" which respectively cover the second polysilicon layers 1005' and 1005", and to form sidewall spacers 1008, as shown in FIG. 9. In this embodiment, reactive ion etching is performed.

Figure 10:
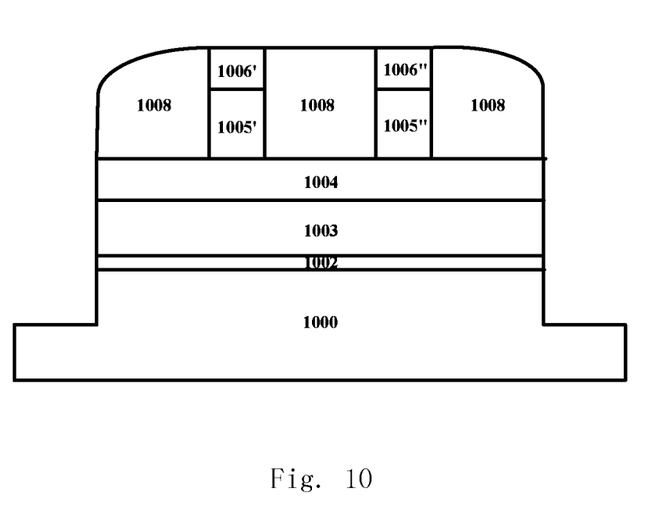
FIG. 10 shows a cross-sectional view of a semiconductor structure after forming trenches of second shallow trench isolations in the method for manufacturing the semiconductor structure according to the embodiment of the present disclosure.

The nitride layer 1004, the first polysilicon layer 1003, the gate dielectric layer 1002 and a portion of the semiconductor substrate 1000 are selectively etched with respect to the oxide to form trenches of second shallow trench isolations, as shown in FIG. 10. In this embodiment, reactive ion etching is performed.

Figure 11:
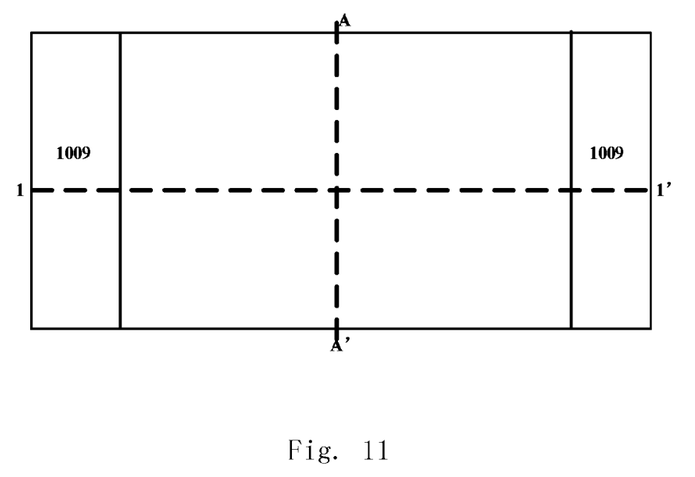
FIG. 11-12 show a top view and a cross-sectional view of a semiconductor structure after forming second shallow trench isolations in the method for manufacturing the semiconductor structure according to the embodiment of the present disclosure, respectively.
Figure 12:
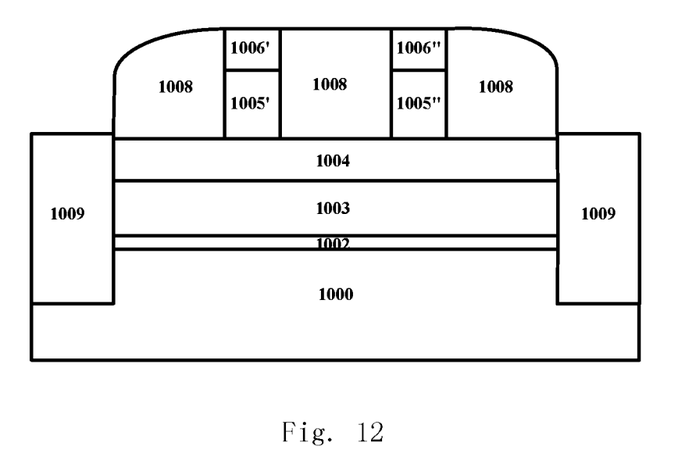

A dielectric material for the shallow trench isolations is deposited, such as $SiO_2$ or $Si_3N_4$. According to an embodiment of the present disclosure, the dielectric for the second shallow trench isolations is preferably nitride, such as $Si_3N_4$, which may reduce loss of the dielectric in the subsequent processing procedure. The nitride is then etched back to form the second trench isolations 1009, as shown in FIGS. 11 and 12.

Figure 13:
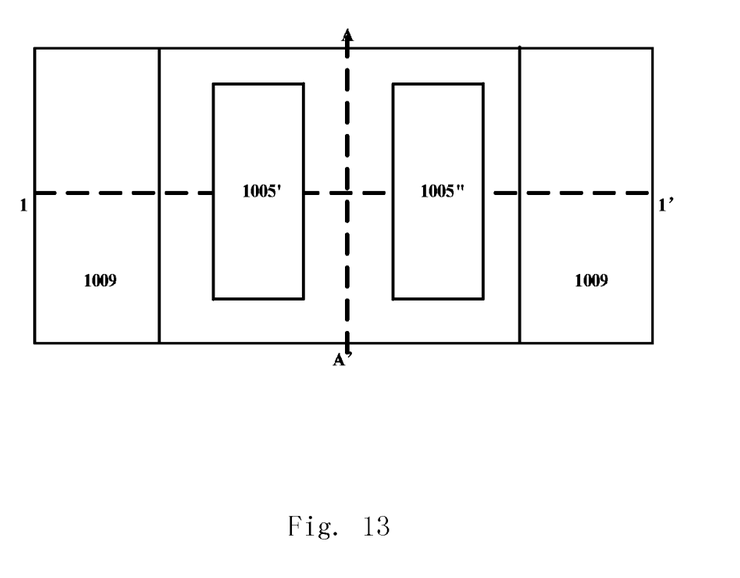
FIG. 13-14 show a top view and a cross-sectional view of a semiconductor structure after removing oxide caps and sidewall spacers in the method for manufacturing the semiconductor structure according to the embodiment of the present disclosure, respectively.
Figure 14:
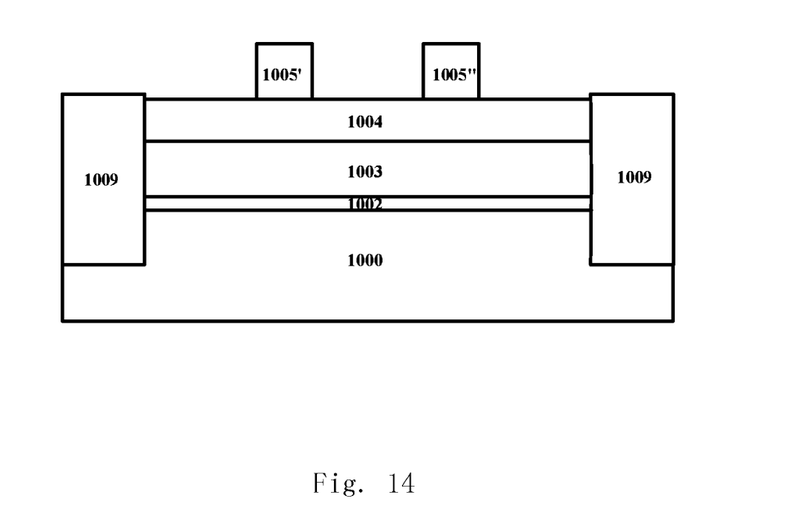

The oxide isolation dielectrics, including the oxide caps 1008' and 1008" at top of the second polysilicon layers 1005' and 1005" and the sidewall spacers 1008, are selectively removed with respect to the polysilicon and the oxide, as shown in FIGS. 13 and 14.

Figure 15:
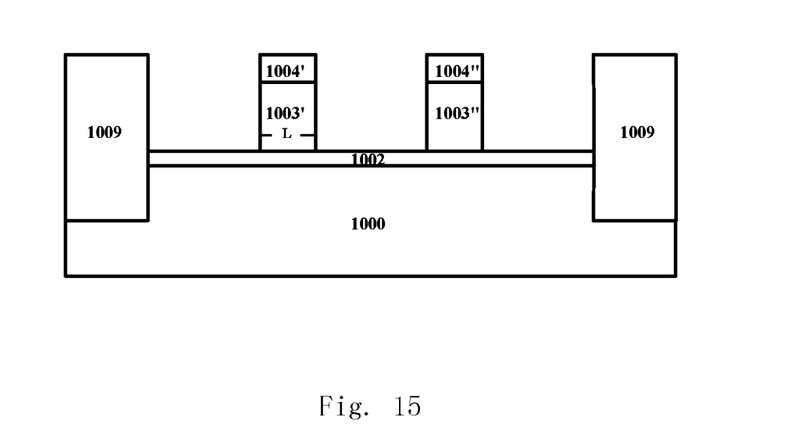
FIG. 15 shows a cross-sectional view of a semiconductor structure after forming gates in the method for manufacturing the semiconductor structure according to the embodiment of the present disclosure.

The nitride 1004 is then etched by reactive ion etching. Next, the first polysilicon layer 1003 and the second polysilicon layers 1005' and 1005" are selectively etched by reactive ion etching with respect to the gate dielectric, to form a structure comprising remaining portions of the nitride layer 1004 which are denoted by 1004' and 1004" and remaining portions of the first polysilicon layer 1003 which are denoted by 1003' and 1003", as shown in FIG. 15. In the specification, the length direction of the gate refers to the length direction indicated by "L" in FIG. 15.

Preferably, source/drain halos and extensions (not shown) can be formed by ion implantation so as to suppress the short channel effect. To form the source/drain extensions, dopants such as As or P may be used in the ion implantation for an nMOSFET, and dopants such as B, $BF_2$, or In may be used in the ion implantation for a pMOSFET. To form the source/drain halos, dopants such as B, $BF_2$, or In may be used in the ion implantation for an nMOSFET, and dopants such as As or P may be used in the ion implantation for a pMOSFET, followed by spike annealing at a temperature of about 900-1100° C. so as to activate the dopants in the source/drain regions.

Figure 16:
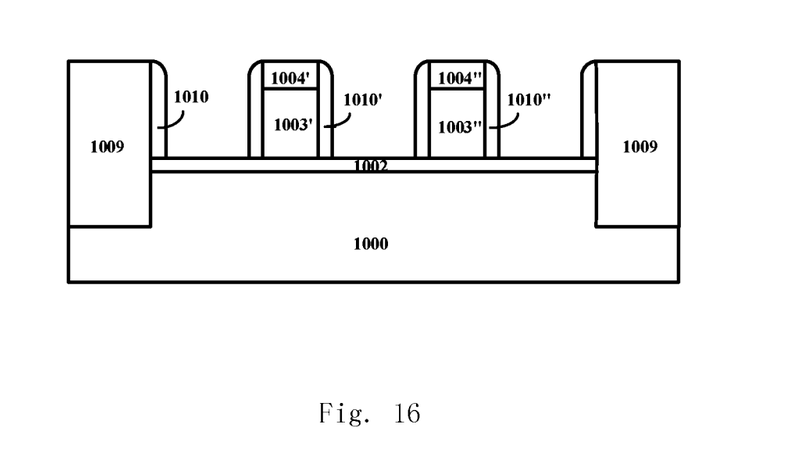
FIG. 16 shows a cross-sectional view of a semiconductor structure after forming sidewall spacers of the gate and sidewall spacers of the second shallow trench isolations in the method for manufacturing the semiconductor structure according to the embodiment of the present disclosure.

Sidewall spacers of the gate are formed. In an embodiment of the present disclosure, the sidewall spacers of the gate and the sidewall spacers of the second shallow trench isolations are preferably formed simultaneously. Specifically, a material of the sidewall spacers, which is one selected from a group consisting of $SiO_2$, $Si_3N_4$, $SiON$ and their combinations, is first deposited. In an embodiment of the present disclosure, the sidewall spacers are preferably made of a nitride and have a thickness in a range of about 5-150 nm, for example, 10 nm, 30 nm, 50 nm, 70 nm, 90 nm, 110 nm, or 130 nm. The deposited layer is then etched by reactive ion etching to form a nitride isolation dielectric, i.e. the sidewall spacers 1010' and 1010" of the gate and the sidewall spacers 1010 of the second shallow trench isolations, as shown in FIG. 16.

Figure 17:
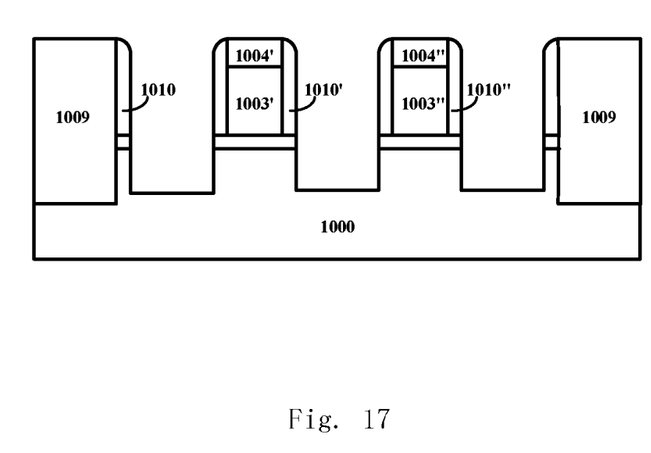
FIG. 17 shows a cross-sectional view of a semiconductor structure after forming source/drain grooves in the method for manufacturing the semiconductor structure according to the embodiment of the present disclosure.

Source/drain regions are formed. In this embodiment, the source/drain regions are preferably formed in a self-aligned manner. Specifically, source/drain grooves are formed by steps shown in FIG. 17, in which the gate dielectric layer 1002 and the semiconductor substrate 1000 are etched with the sidewall spacers of the second shallow trench isolations and the sidewall spacers of the gate as a boundary, so as to form the grooves for the source/drain regions. In this embodiment, reactive ion etching is performed. The etched portion of the semiconductor substrate has a thickness of about 50-150 nm, for example, 60 nm, 70 nm, 80 nm, 90 nm, 100 nm, 110 nm, 120 nm, 130 nm, or 140 nm. Moreover, due to the existence of the sidewall spacers of the second shallow trench isolations, there is a gap between the source/drain grooves and the second shallow trench isolations, as shown in FIG. 17. The gap provides a first seed layer for forming a source/drain stressed material subsequently. The first seed layer has a width in a range of about 5-20 nm, for example, 10 nm or 15 nm.

Figure 18:
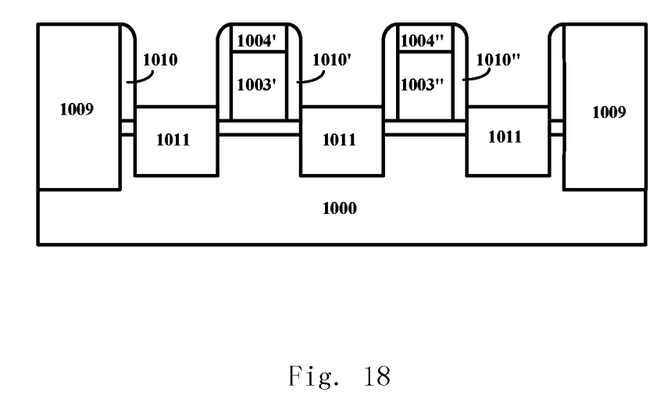
FIG. 18 shows a cross-sectional view of a semiconductor structure after epitaxially growing a stressed material in source/drain regions in the method for manufacturing the semiconductor structure according to the embodiment of the present disclosure.

Preferably, source/drain regions 1011 having a stress are formed by epitaxial growth, as shown in FIG. 18. A stressed layer is selectively epitaxially grown in the formed source/drain grooves to adjust the stress in the channel region of the device, which can increase mobility of carriers in the channel region and improve performance of the device. Specifically, the stressed layer is epitaxially grown from the first seed layer, a second seed layer at bottom of the source/drain grooves, and a third seed layer which comprises portions of the source/drain grooves adjacent to the gate. Alternatively, the stressed layer is epitaxially grown from a third seed layer between adjacent gates and from the second seed layer. According to the above process of the embodiment of the present disclosure, crystal quality in the source/drain regions can be improved, and parasitic resistance of the source/drain regions can be reduced. For a pMOSFET, the stressed material can be $Si_{1-x}Ge_x$ having an atom percentage of Ge in a range of about 15%-70%, for example, 30%, 40%, 50% or 60%, so as to apply compressive stress to the channel. For an nMOSFET, the stressed material can be Si:C having an atom percentage of C in a range of about 0.2%-2%, so as to apply tensile stress to the channel region.

According to an embodiment of the present disclosure, the source/drain regions are formed at both sides of the gate in a self-aligned manner. The method avoids misalignment and improves performance of the device while increasing integration level and lowering manufacture cost.

Moreover, the upper surface of the shallow trench isolation is higher than that of the source/drain regions, which prevents the stress from being released via lateral interfaces and enhances the stress in the channel region, and in turn increases mobility of carriers.

Preferably, the upper surface of the second shallow trench isolation 1009 is about 20-150 nm higher than the upper surface of the source/drain regions.

Figure 19:
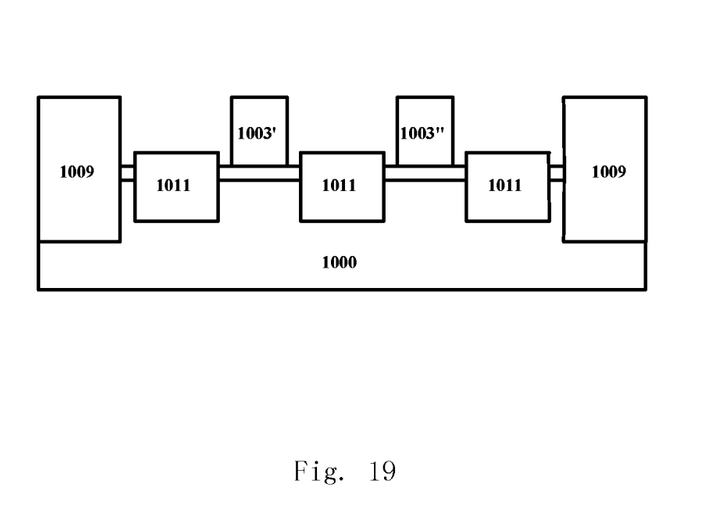
FIG. 19 shows a cross-sectional view of a semiconductor structure after removing a nitride isolation dielectric in the method for manufacturing the semiconductor structure according to the embodiment of the present disclosure.

The nitride layers 1004', 1004" is removed by reactive ion etching to expose the top of the gate. That is, the first polysilicon layers 1003', 1003" are exposed. Moreover, the nitride layers 1004', 1004" and the nitride isolation dielectric can be removed simultaneously. That is, the sidewall spacers 1010' and 1010" of the gate and the sidewall spacers 1010 of the second shallow trench isolations can be removed simultaneously to obtain a structure as shown in FIG. 19.

Preferably, sidewall spacers 1012 of the second shallow trench isolations and sidewall spacers 1012' and 1012" can be formed together. Details of the formation process are similar to what has been described above, and description thereof is omitted. Ions are implanted into the source/drain regions. For an nMOSFET, the ion being implanted is As or P. Preferably, the source/drain regions can be in-situ doped with B in the above step of epitaxially growing the $Si_{1-x}Ge_x$, if necessary. For a pMOSFET, the ion being implanted is B, $BF_2$ or In. Furthermore, the dopants are activated by performing annealing. Preferably, the source/drain regions can be in-situ doped with As or P in the above step of epitaxially growing the Si:C, if necessary.

Figure 20:
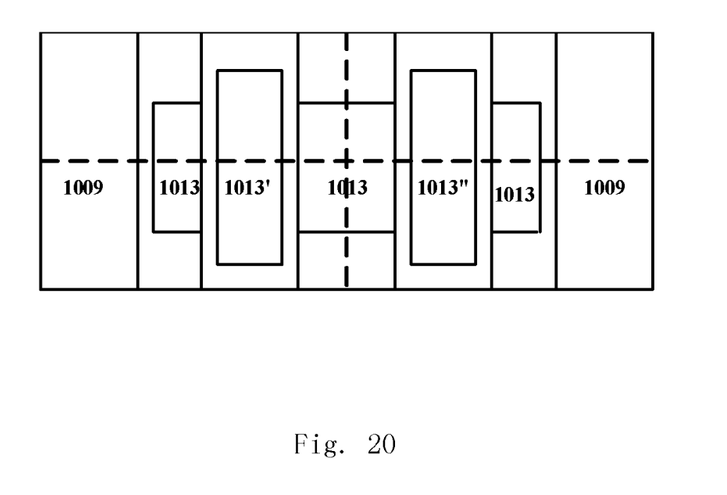
FIGS. 20-21 show a top view and a cross-sectional view of a semiconductor structure after forming a metal silicide in the method for manufacturing the semiconductor structure according to the embodiment of the present disclosure, respectively.
Figure 21:
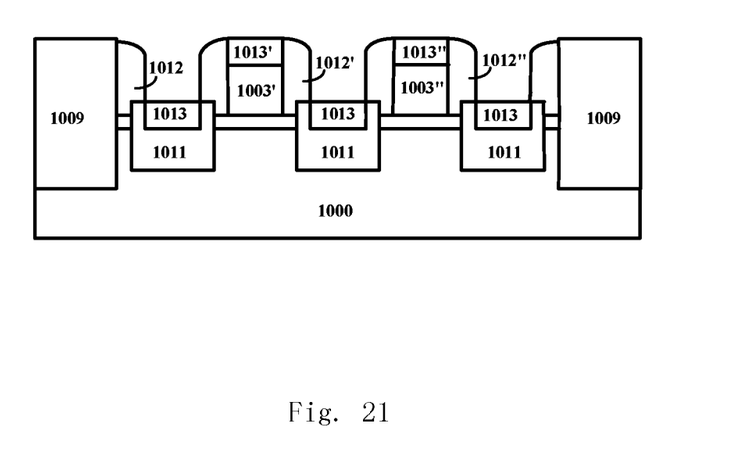

Metal silicides 1013 are formed, as shown in FIGS. 20 and 21. The metal silicides 1013 such as NiPtSi are formed on the source/drain regions 1011 and a gate conductive layer (for example, the first polysilicon layers 1003' and 1003") by a conventional process. The process may comprise: sputtering a thin layer of NiPt; performing rapid thermal annealing at about 300-500° C. to form a silicide NiPtSi; removing unreacted metals by selective wet etching; and performing rapid thermal annealing again to form the silicides 1013 of low resistance.

Preferably, the contacts are formed in a self-aligned manner. According to an embodiment of the present disclosure, an optional conductive contact liner (for example, Ti or TiN) may be formed on an outer surface of the contact hole. The contact hole refers to a region defined by the sidewall spacer of the second shallow trench isolation, an upper surface of the source/drain regions 1011 and the sidewall spacer 1012' or 1012" of the gate, or a region defined by the adjacent sidewall spacers 1012' and 1012" of adjacent gates and an upper surface of the source/rain region. According to an embodiment of the present disclosure, the sidewall spacers of the gate and the sidewall spacers of the second shallow trench isolations are preferably formed simultaneously. Thus, corresponding regions of the contact holes are those defined by the sidewall spacers 1012 of the second shallow trench isolations, the upper surface of the source/drain regions 1011 and the sidewall spacers 1012' or 1012" of the gate. In an embodiment of the present disclosure, the upper surface of the source/drain regions is metal silicide 1013. A conductive filling material 1014 (for example, a metal such as W) is then deposited to fill up the contact holes. Thus, self-aligned contacts are formed on the silicide regions of the source/drain regions. The contacts are then planarized. For example, the surface of the conductive material 1014 (for example a metal such as W) is polished by Chemical Mechanical Polishing (CMP) which stops at the nitride layer. The conductive material is then etched back to avoid shorts.

The method maximizes the contact area between the contact and the silicide so as to minimize a contact resistance, and further avoids junction leakage in a conventional contact caused by etching for the contacts penetrating the sidewall spacers adjacent to the gate.

Figure 22:
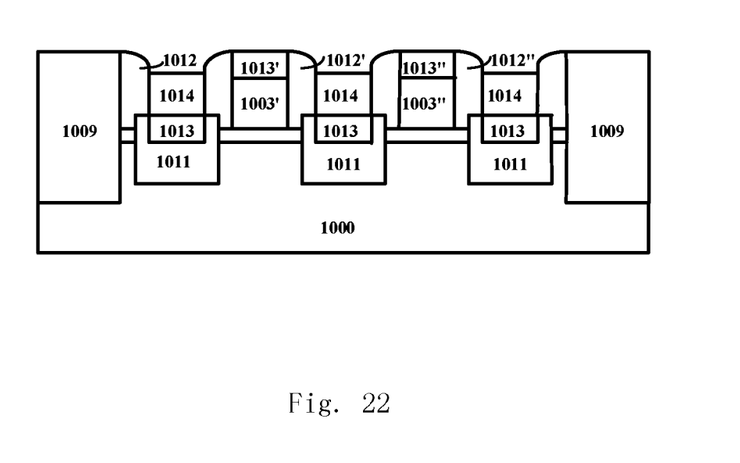
FIG. 22 shows a cross-sectional view of a resultant semiconductor structure in the method for manufacturing the semiconductor structure according to the embodiment of the present disclosure.

Finally, a semiconductor structure according to an embodiment of the present disclosure is formed, as shown in FIG. 22. The semiconductor structure comprises: a semiconductor substrate 1000; a gate on the semiconductor substrate; sidewall spacers 1012' and 1012" adjacent to the gate; source/drain regions 1011 on both sides of the gate; contacts 1014 formed on the source/drain regions 1011; first shallow trench isolations 1001 which are embedded in the semiconductor substrate 1000 and have a length direction parallel to that of the gate; second shallow trench isolations 1009 which are located on both sides of the outmost source/drain regions and connected with the first shallow isolations 1001 to form an isolation region, wherein the upper surface of the second shallow trench isolation 1009 is higher than that of the source/drain regions 1011.

According to the embodiment of the present disclosure, the semiconductor structure can comprise one or more gates.

Optionally, the contacts 1014 are self-aligned with the gate.

Preferably, the upper surface of the second shallow trench isolation 1009 is about 20-150 nm higher than that of the source/drain regions 1011.

Optionally, the semiconductor structure further comprises sidewall spacers 1012 of the second shallow trench isolations which are adjacent to the respective second trench isolations 1009 at a side close to the source/drain regions.

Optionally, the source/drain regions 1011 are self-aligned with the gate.

Optionally, the sidewall spacers are made of $Si_3N_4$.

Optionally, the source/drain regions 1011 comprise a stressed material which applies stress to the channel region. Optionally, the stressed material is $Si_{1-x}Ge_x$ for a pMOSFET, and Si:C for an nMOSFET.

Optionally, in the $Si_{1-x}Ge_x$, an atom percentage of Ge is in a range of about 15%-70%; and in the Si:C, an atom percentage of C is in a range of about 0.2%-2%.

Optionally, the filling dielectric in the second shallow trench isolations 1009 is $Si_3N_4$.

In an embodiment of the present disclosure, the second shallow trench isolations are formed with an upper surface higher than that of the gate. Contact holes are formed by regions defined by the sidewall spacers of the second shallow trench isolations, the sidewall spacers of the gate and the upper surface of the source/drain regions. Contacts are formed in a self-aligned manner. Compared with the conventional technology, the present disclosure can not only increase the contact area, reduce a contact resistance, but also can omits steps of etching the contact holes, which can avoid shorts between the gate and the contact plugs, while reducing areas occupied by devices and lowering manufacture cost.

In the above description, details of patterning and etching of various layers are not specifically explained. Nevertheless, one skilled person will appreciate that the layers and regions having desired shapes can be formed by various methods well known in the field. Moreover, one skilled person may propose a process not completely the same as the above processes for forming the same structure.

Various embodiments of the present disclosure have been described above. It should be understood that they have been presented by way of example, and not limitation on the protection scope of the present disclosure. The protection scope is defined by the attached claims and their equivalences. One skilled person will readily recognize that various modifications and changes may be made to the present disclosure, without departing from the true scope of the present disclosure.

The invention claimed is:

1. A semiconductor structure, comprising:
   a semiconductor substrate;
   at least one gate formed on the semiconductor substrate;
   sidewall spacers adjacent to the gate;
   source/drain regions on both sides of the gate;
   contacts formed on the source/drain regions;
   first shallow trench isolations which are embedded in the semiconductor substrate and have a length direction parallel to that of the gate; and
   second shallow trench isolations which are separated from each other and located on both sides of the outmost source/drain regions and connected with the first shallow isolations to form an isolation region,
   wherein an upper surface of the second shallow trench isolation is higher than that of the source/drain regions and that of the first shallow trench isolations;
   wherein a lower surface of the second shallow trench isolation is lower than the upper surface of the first shallow trench isolation; and
   wherein each of the at least one gate is formed astride, at opposite ends thereof, the first shallow trenches.

2. The semiconductor structure according to claim 1, wherein the contacts are self-aligned with the gate.

3. The semiconductor structure according to claim 1, wherein the upper surface of the second shallow trench isolation is 20-150 nm higher than the upper surface of the source/drain regions.

4. The semiconductor structure according to claim 1, further comprising sidewall spacers of the second shallow trench isolations which are adjacent to the respective second trench isolations at a side close to the source/drain regions.

5. The semiconductor structure according to claim 1, wherein the source/drain regions are self-aligned with the gate.

6. The semiconductor structure according to claim 1, wherein the sidewall spacers are made of Si3N4.

7. The semiconductor structure according to claim 1, wherein the source/drain regions comprise a stressed material.

8. The semiconductor structure according to claim 7, wherein the stressed material is Si1-xGex for a pMOSFET, where 0<x<1, and Si:C for an nMOSFET.

9. The semiconductor structure according to claim 8, wherein in the Si1-xGex, an atom percentage of Ge is in a range of 15%-70%; and in the Si:C, an atom percentage of C is in a range of 0.2%-2%.

10. The semiconductor structure according of claim 1, wherein a filling dielectric in the second shallow trench isolations is Si3N4.

11. A method for manufacturing a semiconductor structure, comprising:
    providing a semiconductor substrate;
    forming first shallow trench isolations and second shallow trench isolations which are connected with each other and form an isolation region;
    forming at least one gate which includes a dielectric layer and a conductive layer and has a length direction parallel to that of the first shallow trench isolations, each of the at least one gate being formed astride, at opposite ends thereof, the first shallow trenches;
    forming sidewall spacers of the gate;
    forming source/drain regions at both sides of the gate; and
    forming contacts on the source/drain regions,
    wherein the second shallow trench isolations are separated from each other and oppositely located on both sides of the outmost source/drain regions;
    wherein an upper surface of the second shallow trench isolation is higher than that of the source/drain regions and that of the first shallow trench isolations; and
    wherein a lower surface of the second shallow trench isolation is lower than the upper surface of the first shallow trench isolation.

12. The method according to claim 11, wherein the contacts are self-aligned with the gate.

13. The method according to claim 11, wherein the upper surface of the second shallow trench isolation is 20-150 nm higher than that of the source/drain regions.

14. The method according to claim 11, wherein sidewall spacers of the second shallow trench isolations are formed at a side of the respective second trench isolations close to the source/drain regions.

15. The method according to claim 14, wherein the step of forming a contact comprises: forming a region defined as a contact hole by the sidewall spacer of the gate, the sidewall spacer of the second shallow trench isolation which is adjacent to the sidewall spacer of the gate, and an upper surface of the source/drain regions; and filling the contact hole with a conductive material to form the contact.

16. The method according to claim 11, wherein the step of forming a contact comprises: forming a region defined as a contact hole by two adjacent sidewall spacers of two adjacent gates and an upper surface of the source/drain regions; and filling the contact hole with a conductive material to form the contact.

17. The method according to claim 11, wherein the source/drain regions are formed at both sides of the gate in a self-aligned manner.

18. The method according to claim 14, wherein the step of forming the source/drain regions comprises:
etching the gate dielectric layer and the semiconductor substrate downwards with the sidewall spacer of the gate and the sidewall spacer of the second shallow trench isolation which is adjacent to the gate as a boundary, or with two adjacent sidewall spacers of two adjacent gates as a boundary, to form a source/drain groove; and
epitaxially growing a stressed material in a case where a portion of the source/drain groove adjacent to the gate or a portion of the source/drain groove adjacent to the second shallow trench isolation serves as a first seed layer, the bottom of the source/drain groove serves as a second seed layer, and a portion of the source/drain groove adjacent to the adjacent gate serves as a third seed layer.

19. The method according to claim 18, wherein before formation of the source/drain groove and after formation of the gate, the method further comprises: forming source/drain extensions and source/drain halos.

20. The method according to claim 19, wherein the step of forming the source/drain extensions comprises: implanting one selected from a group consisting of B, BF2, In and their combinations for a pMOSFET, and implanting one selected from a group consisting of As, P and their combinations for an nMOSFET.

21. The method according to claim 20, wherein the step of forming the source/drain halos comprises implanting one selected from a group consisting of As, P and their combinations for a pMOSFET, and implanting one selected from a group consisting of B, BF2, In and their combinations for an nMOSFET.

22. The method according to claim 18, wherein the stressed material is Si1-xGex for a pMOSFET, where 0<x<1, and Si:C for an nMOSFET.

23. The method according to claim 22, wherein in the Si1-xGex, an atom percentage of Ge is in a range of 15%-70%; and in the Si:C, an atom percentage of C is in a range of 0.2%-2%.

24. The method according to claim 18, wherein the source/drain regions are in-situ doped when epitaxially growing the stressed material.

25. The method according to claim 24, wherein the source/drain regions are in-situ doped with B when epitaxially growing Si1-xGex, and with P when epitaxially growing Si:C.

26. The method according of claim 11, wherein a filling dielectric in the second shallow trench isolations is Si3N4.

* * * * *